(12) United States Patent
Lee et al.

(10) Patent No.: US 8,963,404 B2
(45) Date of Patent: Feb. 24, 2015

(54) ENERGY HARVESTING DEVICES AND METHODS OF FABRICATING THE SAME

(75) Inventors: Sang Kyun Lee, Gwangju (KR); Moonkeun Kim, Gyeonggi-do (KR); Yil Suk Yang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 354 days.

(21) Appl. No.: 13/606,246

(22) Filed: Sep. 7, 2012

(65) Prior Publication Data

US 2013/0154439 A1    Jun. 20, 2013

(30) Foreign Application Priority Data

Dec. 16, 2011 (KR) .......................... 10-2011-0136701

(51) Int. Cl.
*H02N 2/18* (2006.01)
(52) U.S. Cl.
CPC .................................... *H02N 2/18* (2013.01)
USPC ........................................................ 310/370
(58) Field of Classification Search
CPC ........................................................ H02N 2/18
USPC ........................................................ 310/339
See application file for complete search history.

(56) References Cited

U.S. PATENT DOCUMENTS

| | | | |
|---|---|---|---|
| 6,747,573 B1 * | 6/2004 | Gerlach et al. | 340/870.21 |
| 7,414,351 B2 * | 8/2008 | Ulm et al. | 310/330 |
| 2007/0188053 A1 * | 8/2007 | Stark | 310/339 |
| 2008/0277941 A1 * | 11/2008 | Bowles et al. | 290/54 |
| 2011/0048133 A1 * | 3/2011 | Lin et al. | 73/514.34 |
| 2011/0210554 A1 | 9/2011 | Boysel | |
| 2012/0267982 A1 * | 10/2012 | Carman et al. | 310/318 |
| 2013/0082571 A1 * | 4/2013 | Tabata et al. | 310/319 |
| 2013/0207520 A1 * | 8/2013 | Near | 310/339 |

OTHER PUBLICATIONS

Dongna Shen et al., "Micromachined PZT cantilever based on SOI structure for low frequency vibration energy harvesting", Sensors and Actuators A: Physical, Aug. 31, 2009, pp. 103-108, vol. 154, Issue 1.

R. Xu et al., "Screen Printed PZT/PZT Thick Film Bimorph Mems Cantilever Device for Vibration Energy Harvesting", IEEE, Jun. 5-9, 2011, pp. 679-682.

* cited by examiner

*Primary Examiner* — J. San Martin
(74) *Attorney, Agent, or Firm* — Rabin & Berdo, P.C.

(57) ABSTRACT

Energy harvesting devices are provided. The energy harvesting device includes a body, a proof mass spaced apart from the body, a cantilever extending from the body onto the proof mass, a first electrode layer on the cantilever opposite to the body, a first piezoelectric layer on the first electrode layer, a second electrode layer on the first piezoelectric layer, a second piezoelectric layer on the second electrode layer, a pair of third electrode layers on the second piezoelectric layer, and a magnetic layer between the second electrode layer and the second piezoelectric layer. Related methods are also provided.

20 Claims, 6 Drawing Sheets

ENERGY HARVESTING DEVICES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2011-0136701, filed on Dec. 16, 2011, the disclosure of which is hereby incorporated by reference in its entirety.

BACKGROUND

1. Technical Field

The present disclosure herein relates to electronic devices and methods of fabricating the same and, more particularly, to energy harvesting devices and methods of fabricating the same.

2. Description of Related Art

Recently, diverse electronic devices have been produced with development of electronic communication technologies. For example, the electronic devices such as portable electronic devices have been abruptly in demand since the portable electronic devices can be realized with user-centered ubiquitous products. The portable electronic devices may need portable power supplies such as batteries. However, there may be some limitations in using the batteries because the batteries may be disposable or should be periodically recharged. Accordingly, the necessity of energy harvesting technologies and energy harvesting devices may be increasingly required to effectively use the portable electronic devices.

The energy harvesting technologies mean techniques that convert mechanical energy wasted in nature into electric energy. The mechanical energy wasted in nature may includes vibration energies generated by vibrations of trains, vibrations of vacuum pumps, vibrations of mechanical motors, vibrations of automobile engines and human movements. Since the energy harvesting devices become extremely miniaturized according to application areas thereof, many efforts have been concentrated on micro-electro-mechanical system (MEMS) vibration energy harvesting devices utilizing piezoelectric characteristics, which are appropriate for power supplies of micro devices. Typical vibration energy harvesting devices using the piezoelectric characteristic may have a cantilever structure.

The cantilever structural energy harvesting devices fabricated using MEMS techniques may have infinite possibilities as self power supplies of remote control systems corresponding to wireless sensor nodes. The cantilever structural energy harvesting devices using the vibration energies may generate a high output power in response to a low resonance frequency which is equal to about 100 Hertz or less. Resonance frequencies generated in a general environment may be within a low frequency band. Accordingly, the energy harvesting devices may produce a high energy in the general environment where human beings live.

However, the conventional energy harvesting devices are fabricated in a single mode on a silicon wafer based on the MEMS technique. Thus, the conventional energy harvesting devices may exhibit a low energy harvesting efficiency. Further, according to the conventional energy harvesting devices, it may be difficult to control the resonance frequency of a cantilever.

SUMMARY

Exemplary embodiments are directed to energy harvesting devices and methods of fabricating the same.

According to some embodiments, an energy harvesting device includes a body, a proof mass spaced apart from the body, a cantilever extending from the body onto the proof mass, a first electrode layer on the cantilever opposite to the body, a first piezoelectric layer on the first electrode layer, a second electrode layer on the first piezoelectric layer, a second piezoelectric layer on the second electrode layer, a pair of third electrode layers on the second piezoelectric layer, and a magnetic layer between the second electrode layer and the second piezoelectric layer.

In some embodiments, the magnetic layer may have a magnetic force for controlling a resonance frequency of the cantilever and the proof mass together with an external magnetic field applied to the proof mass.

In some embodiments, the magnetic layer may include a hard magnetic material and/or a soft magnetic material.

In some embodiments, the hard magnetic material may include at least one of carbon steel, strontium rubidium oxide, barium ferrite (Ba-ferrite), samarium cobalt 5 (SmCo5) and neodymium iron boride ($Nd_2Fe_{14}B$).

In some embodiments, the soft magnetic material may include at least one of ferrite, silicon steel and permalloy.

In some embodiments, the resonance frequency of the cantilever and the proof mass may be controlled by intensity of the magnetic force of the magnetic layer.

In some embodiments, the body and the proof mass may include a single crystalline silicon substrate or a silicon-on-insulator (SOI) substrate.

In some embodiments, the cantilever may include a first buffer layer between the body and the proof mass, a shim plate on the first buffer layer opposite to the body and the proof mass, and a second buffer layer on the shim plate opposite to the first buffer layer.

In some embodiments, the shim plate may include a single crystalline silicon material, a polycrystalline silicon material or an amorphous silicon material.

In some embodiments, each of the first and second buffer layers may include a silicon oxide layer.

In some embodiments, each of the first and second piezoelectric layers may include at least one of a piezoelectric ceramic material, a piezoelectric semiconductor and a piezoelectric polymer material.

In some embodiments, each of the piezoelectric ceramic material, the piezoelectric semiconductor and the piezoelectric polymer material may include at least one of PZT, PVDF, PMN-PT, PZN-PT, PMN-PZT, ZnO and AlN.

In some embodiments, the first electrode layer, the first piezoelectric layer and the second electrode layer may have a vertical harvesting mode of the cantilever and the proof mass.

In some embodiments, the pair of third electrode layers and the second piezoelectric layer may have a horizontal harvesting mode of the cantilever and the proof mass.

In some embodiments, the pair of third electrode layers may include a first inter-digital electrode and a second inter-digital electrode which are located at the same level and combined with each other.

In some embodiments, each of the first, second and third electrode layers may include at least one of a platinum layer and a titanium layer.

According to further embodiments, a method of fabricating an energy harvesting device includes providing a substrate, forming a cantilever on the substrate, forming a first electrode layer on the cantilever, forming a first piezoelectric layer on the first electrode layer, forming a second electrode layer on the first piezoelectric layer, forming a magnetic layer on the second electrode layer, forming a second piezoelectric layer on the magnetic layer, forming a pair of third electrode layers separated from each other in a horizontal direction on the second piezoelectric layer, and patterning the cantilever and removing a portion of the substrate to define a body and a proof mass separated from each other.

In some embodiments, forming the cantilever may include forming a first buffer layer on the substrate, forming a shim plate on the first buffer layer, and forming a second buffer layer on the shim plate.

In some embodiments, the magnetic layer may be formed to include a hard magnetic material and/or a soft magnetic material using a sputtering process or a spin coating process.

In some embodiments, the cantilever may be patterned using a dry etching process, and the substrate between the body and the proof mass may be removed using a reactive ion etching (RIE) process or a chemical vapor etching process.

BRIEF DESCRIPTION OF THE DRAWINGS

Embodiments of the inventive concept will become more apparent in view of the attached drawings and accompanying detailed description.

DETAILED DESCRIPTION OF THE EMBODIMENTS

Figure 1:
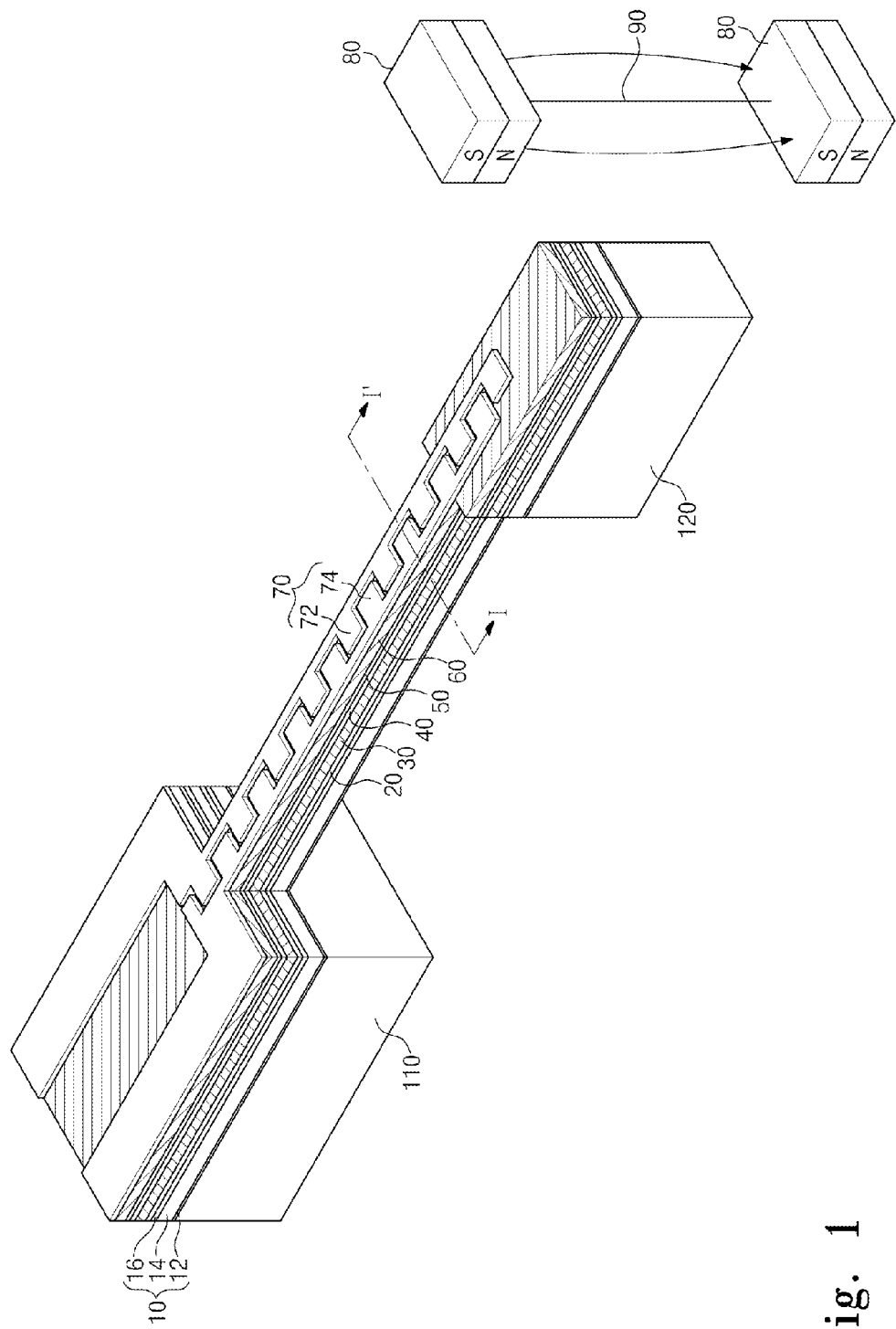
FIG. 1 is a perspective view illustrating an energy harvesting device according to an exemplary embodiment.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Rather, these exemplary embodiments are provided so that this disclosure will be thorough and complete, and will fully convey the scope of the invention to those skilled in the art. The same reference numerals or the same reference designators denote the same elements throughout the specification. In the drawings, the exemplary embodiments of the inventive concept are not limited to the specific examples provided herein and the thicknesses of layers and regions are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that the terms "has", "having", "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. It will be further understood that when an element such as a layer, region or substrate is referred to as being "on" another element, it can be directly on the other element or intervening elements may be present. In contrast, the term "directly" means that there are no intervening elements. Similarly, it will be also understood that when an element is referred to as being "connected" or "coupled" to another element, it may be directly connected or coupled to the other element or intervening elements may be present.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. For example, a region illustrated as a rectangle may have rounded or curved features. Thus, areas exemplified in the drawings have general properties, and are used to illustrate specific shapes of elements. Accordingly, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concepts. Exemplary embodiments of aspects of the present inventive concept explained and illustrated herein include their complementary counterparts.

Figure 2:
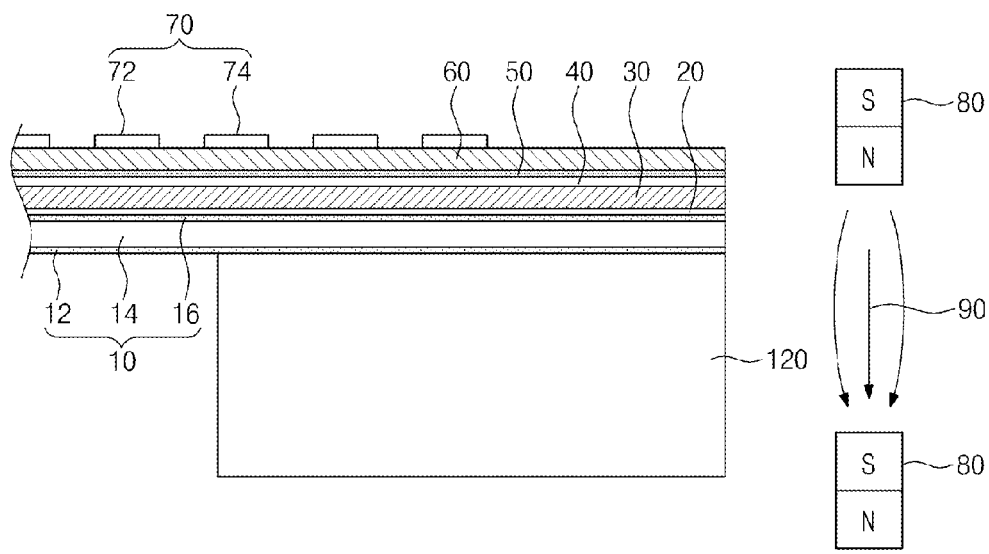
FIG. 2 is an enlarged cross sectional view illustrating a cantilever and a proof mass of FIG. 1.

FIG. 1 is a perspective view illustrating an energy harvesting device according to an exemplary embodiment. FIG. 2 is an enlarged cross sectional view illustrating a cantilever and a proof mass of FIG. 1, and FIG. 3 is a vertical cross sectional view taken along a line I-I' of FIG. 1.

Figure 3:
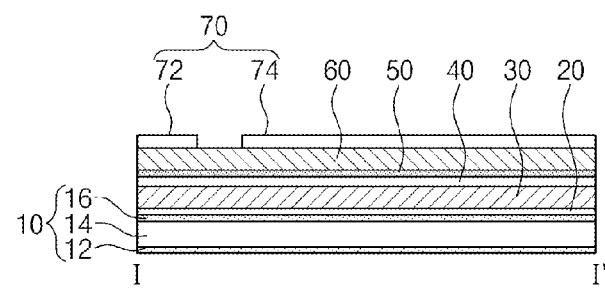
FIG. 3 is a vertical cross sectional view taken along a line I-I' of FIG. 1.

Referring to FIGS. 1, 2 and 3, an energy harvesting device according to an exemplary embodiment may include a cantilever 10, a first piezoelectric layer 30 and a second piezoelectric layer 60 stacked on the cantilever 10, and a magnetic layer 50 between the first and second piezoelectric layers 30 and 60. The cantilever 10 may connect a body 110 to a proof mass 120. The proof mass 120 may have its own resonance frequency and may reciprocate (or oscillate) vertically and/or horizontally. The resonance frequency of the cantilever 10 and the proof mass 120 may be controlled by an external magnetic field 90. This is because the magnetic layer 50 has a magnetic force that acts as an attractive force or a repulsive force in response to the external magnetic field 90. The external magnetic field 90 may control the resonance frequency of the reciprocating motions of the cantilever 10 and the proof mass 120. Thus, since the resonance frequency of the cantilever 10 and the proof mass 120 can be controlled to have a low frequency of about 100 Hertz or less, the output power of the energy harvesting device according to the present exemplary embodiment can be maximized.

The energy harvesting device according to the present exemplary embodiment may be a MEMS device. The body 110 and the proof mass 120 may include a single crystalline silicon substrate or a silicon-on-insulator (SOI) substrate. The cantilever 10 may be disposed between the body 110 and the proof mass 120. The cantilever 10 may include a first buffer layer 12, a second buffer layer 16, and a shim plate 14 between the first and second buffer layers 12 and 16. The shim plate 14 may include a single crystalline silicon material, a polycrystalline silicon material or an amorphous silicon material. Each of the first and second buffer layers 12 and 16 may include a silicon oxide layer.

A first electrode layer 20, a second electrode layer 40 and a third electrode layer 70 may be disposed on the cantilever 10 opposite to the body 110 and the proof mass 120. The first piezoelectric layer 30 may be disposed between the first and second electrode layers 20 and 40, and the second piezoelectric layer 60 may be disposed between the second and third electrode layers 40 and 70. Each of the first and second piezoelectric layers 30 and 60 may include a piezoelectric ceramic material or a piezoelectric polymer material which contains PMN-PT, PZN-PT or PMN-PZT. According to some exemplary embodiments, the first piezoelectric layers 30 may include a piezoelectric ceramic material and the second piezoelectric layer 60 may include a piezoelectric polymer material.

The first piezoelectric layer 30 may generate a power of a vertical harvesting mode (D31 mode) in response to a vertical oscillation movement of the cantilever 10 and may output the power of the vertical harvesting mode (D31 mode) through the first and second electrode layers 20 and 40. Each of the first and second electrode layers 20 and 40 may include conductive metal such as platinum (Pt), gold (Au), silver (Ag), aluminum (Al) or copper (Cu). The first electrode layer 20, the first piezoelectric layer 30 and the second electrode layer 40 may constitute a first energy harvesting device.

The second piezoelectric layer 60 may generate a power of a horizontal harvesting mode (D33 mode) in response to a horizontal oscillation movement of the cantilever 10 and may output the power of the horizontal harvesting mode (D33 mode) through the third electrode layer 70. The third electrode layer 70 may include a first inter-digital electrode 72 and a second inter-digital electrode 74 which are located at the same level and combined with each other. The first inter-digital electrode 72, the second inter-digital electrode 74 and the second piezoelectric layer 60 may constitute a second energy harvesting device. Each of the first and second inter-digital electrodes 72 and 74 may include conductive metal. The first to third electrode layers 20, 40 and 70 may output the power of the vertical harvesting mode (D31 mode) and the power of the horizontal harvesting mode (D33 mode), thereby minimizing the energy loss.

The magnetic layer 50 may be disposed between the second electrode layer 40 and the second piezoelectric layer 60. That is, the magnetic layer 50 may separate the first piezoelectric layer 30 of the first energy harvesting device from the second piezoelectric layer 60 of the second energy harvesting device. The magnetic layer 50 may include a hard magnetic material and/or a soft magnetic material. The hard magnetic material may include at least one of carbon steel, strontium rubidium oxide, barium ferrite (Ba-ferrite), samarium cobalt 5 (SmCo5) and neodymium iron boride (Nd$_2$Fe$_{14}$B). The soft magnetic material may include at least one of ferrite, silicon steel and permalloy. As described above, the resonance frequency of the cantilever 10 and the proof mass 120 may be controlled by the external magnetic field 90. When the cantilever 10 and the proof mass 120 oscillate at a low resonance frequency of about 100 Hertz or less, the energy harvesting efficiency may be increased. The resonance frequency of the cantilever 10 and the proof mass 120 may be expressed by the following equation 1.

$$fn = \frac{1}{2\pi}\sqrt{\frac{k}{m}} \quad \text{(Equation 1)}$$

In the equation 1, "fn" denotes the resonance frequency of the cantilever 10 and the proof mass 120, and "m" denotes a mass of the cantilever 10 and the proof mass 120. Further, "k" denotes an elastic coefficient of the cantilever 10.

As can be seen from the equation 1, the resonance frequency "fn" may increase in proportion to the elastic coefficient "k" of the cantilever 10. The magnetic layer 50 may control the elastic coefficient "k" of the cantilever 10 in response to the external magnetic field 90. The external magnetic field 90 may be induced by a plurality of permanent magnets 80. The permanent magnets 80 may include at least one north polar magnet and at least one south polar magnet which face each other. The permanent magnets 80 may be fixed to or moved against the proof mass 120. The proof mass 120 may vertically and/or horizontally oscillate in a space between the permanent magnets 80. In such a case, the resonance frequency of the cantilever 10 and the proof mass 120 may be controlled by the magnetic force between the permanent magnets 80 and the magnetic layer 50. That is, the magnetic force between the permanent magnets 80 and the magnetic layer 50 may control the resonance frequency of the cantilever 10 and the proof mass 120.

Therefore, since the resonance frequency of the cantilever 10 and the proof mass 120 is controlled by the magnetic force of the magnetic layer 50, the output power of the energy harvesting device according to the exemplary embodiments can be increased and/or maximized.

Methods of fabricating energy harvesting devices according to the exemplary embodiments are now described hereinafter.

FIGS. 4 to 11 are vertical cross sectional views illustrating methods of fabricating energy harvesting devices according to some exemplary embodiments.

Figure 4:
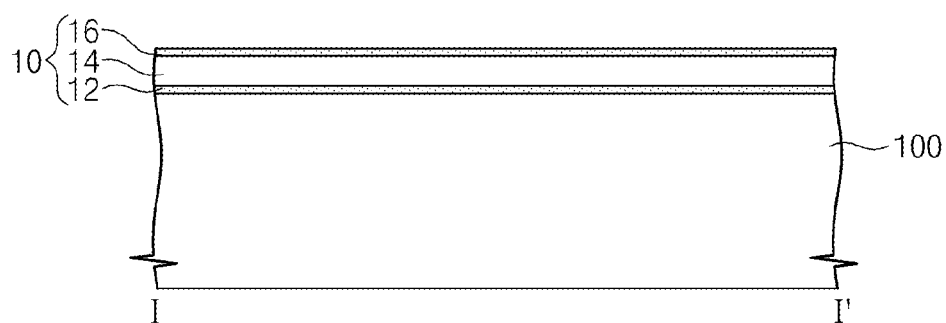
FIGS. 4 to 11 are vertical cross sectional views illustrating a method of fabricating an energy harvesting device according to an exemplary embodiment.

Referring to FIG. 4, a cantilever 10 may be formed on a substrate 100. The cantilever 10 may be formed on the substrate 100 such as a single crystalline silicon substrate using a chemical vapor deposition (CVD) process or a physical vapor deposition (PVD) process. The cantilever 10 may be formed to include a first buffer layer 12 on the substrate 100, a shim plate 14 on the first buffer layer 12 opposite to the substrate 100, and a second buffer layer 16 on the shim plate 14 opposite to the first buffer layer 12. Each of the first and second buffer layers 12 and 16 may be formed to include a silicon oxide layer. The shim plate 14 may be formed to include a single crystalline silicon layer, a polycrystalline silicon layer or an amorphous silicon layer. The cantilever 10 and the substrate 100 may be formed using a typical silicon-on-insulator (SOI) substrate.

Figure 5:
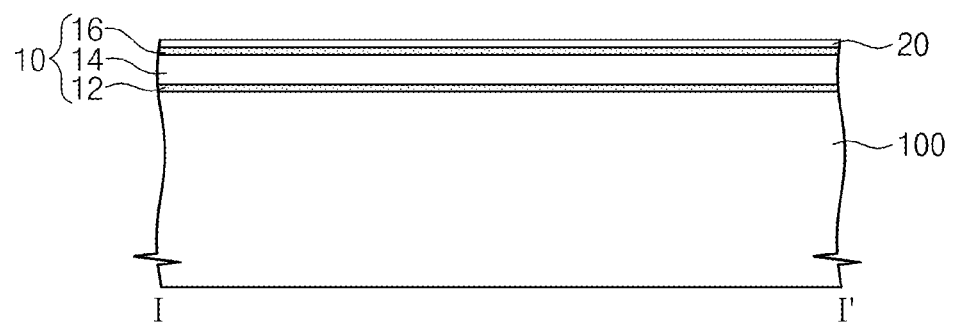

Referring to FIG. 5, a first electrode layer 20 may be formed on the cantilever 10 opposite to the substrate 100. The first electrode layer 20 may be formed of a conductive layer such as a platinum (Pt) layer, a gold (Au) layer, a silver (Ag) layer, an aluminum (Al) layer or copper (Cu) layer using a physical vapor deposition (PVD) process, for example, a sputtering process. The first electrode layer 20 may be formed to a thickness of about 0.1 micrometers to about 1.0 micrometers.

Figure 6:
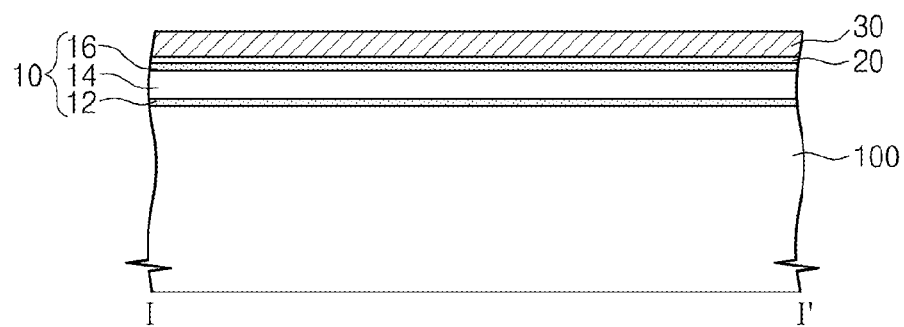

Referring to FIG. 6, a first piezoelectric layer 30 may be formed on the first electrode layer 20. The first piezoelectric layer 30 may be formed of a piezoelectric ceramic material or a piezoelectric semiconductor using a chemical vapor deposition (CVD) process or a physical vapor deposition (PVD) process. The piezoelectric ceramic material or the piezoelectric semiconductor may include at least one of PZT, PVDF, PMN-PT, PZN-PT, PMN-PZT, ZnO and AlN. The first piezoelectric layer 30 may be formed to a thickness of about 1 micrometer to about 5 micrometers.

Figure 7:
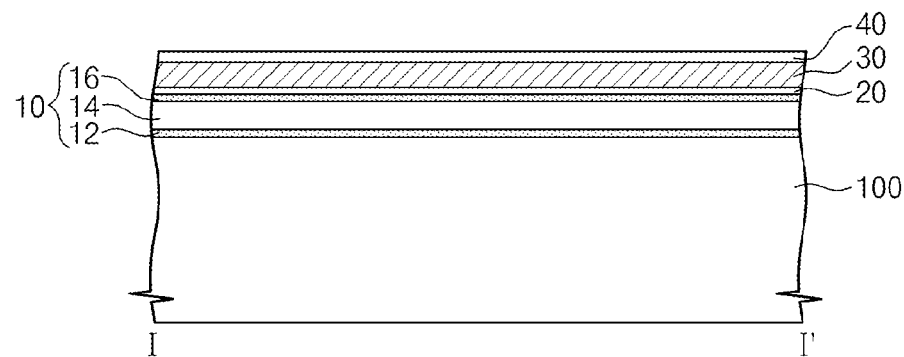

Referring to FIG. 7, a second electrode layer 40 may be formed on the first piezoelectric layer 30. The second electrode layer 40 may be formed of a conductive layer such as a platinum (Pt) layer, a gold (Au) layer, a silver (Ag) layer, an aluminum (Al) layer, a copper (Cu) layer or a titanium (Ti) layer using a physical vapor deposition (PVD) process, for example, a sputtering process. The second electrode layer 40, for example, a titanium (Ti) layer may prevent the first piezoelectric layer 30 from being diffused.

Figure 8:
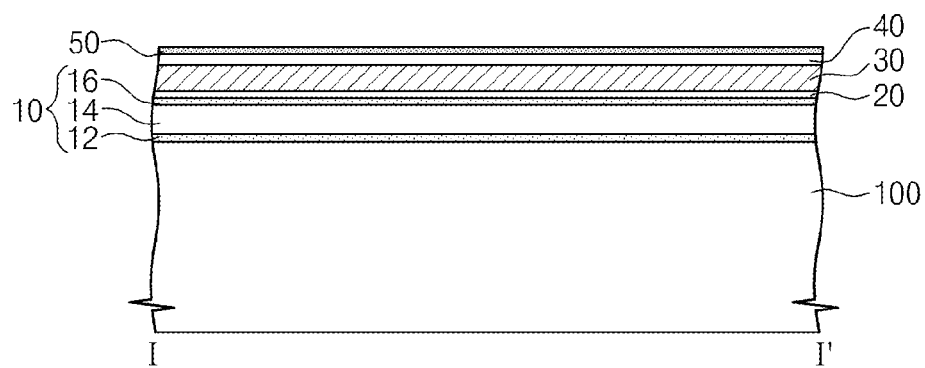

Referring to FIG. 8, a magnetic layer 50 may be formed on the second electrode layer 40. The magnetic layer 50 may be formed using a chemical vapor deposition (CVD) process or a physical vapor deposition (PVD) process. The magnetic layer 50 may include a hard magnetic material and a soft magnetic material. The hard magnetic material may include carbon steel, strontium rubidium oxide, barium ferrite (Ba-ferrite), samarium cobalt 5 (SmCo5) or neodymium iron boride ($Nd_2Fe_{14}B$). The soft magnetic material may include ferrite, silicon steel or permalloy.

Figure 9:
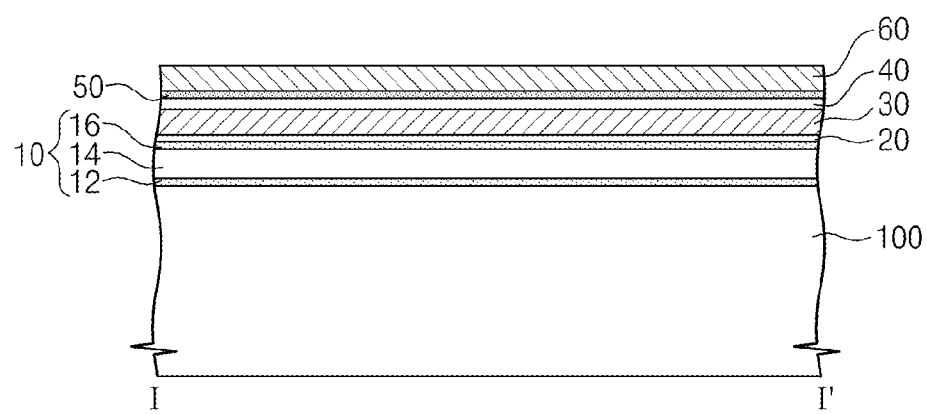

Referring to FIG. 9, a second piezoelectric layer 60 may be formed on the magnetic layer 50. The second piezoelectric layer 60 may be formed of a piezoelectric ceramic material or a piezoelectric semiconductor using a chemical vapor deposition (CVD) process or a physical vapor deposition (PVD) process. The piezoelectric ceramic material or the piezoelectric semiconductor may include at least one of PZT, PMN-PT, PZN-PT, PMN-PZT, ZnO and AlN.

Figure 10:
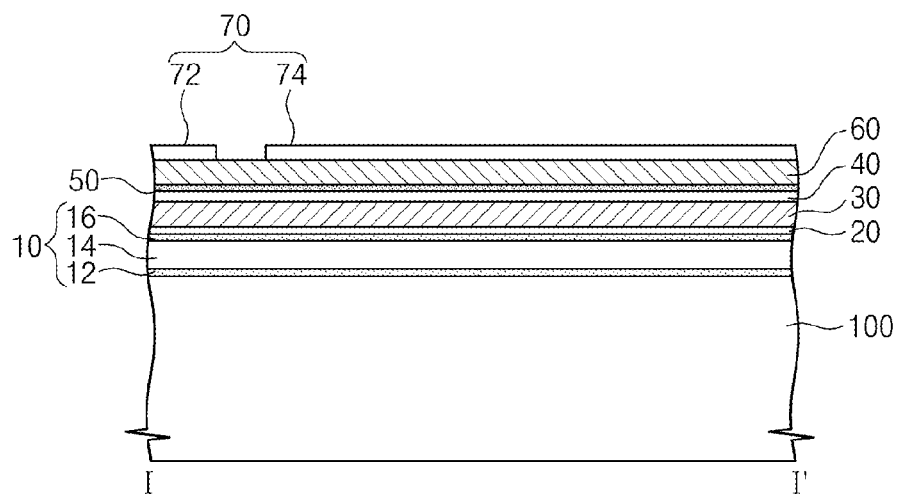

Referring to FIG. 10, a third electrode layer 70 may be formed on the second piezoelectric layer 60. The third electrode layer 70 may be formed of a conductive metal layer such as a platinum (Pt) layer, a gold (Au) layer, a silver (Ag) layer, an aluminum (Al) layer, a copper (Cu) layer or a titanium (Ti) layer using a physical vapor deposition (PVD) process, for example, a sputtering process. The third electrode layer 70 may be patterned to form a pair of inter-digital electrodes 72 and 74 which are separated from each other. The third electrode layer 70 may be patterned using a photolithography process or an ion beam lithography process.

Figure 11:
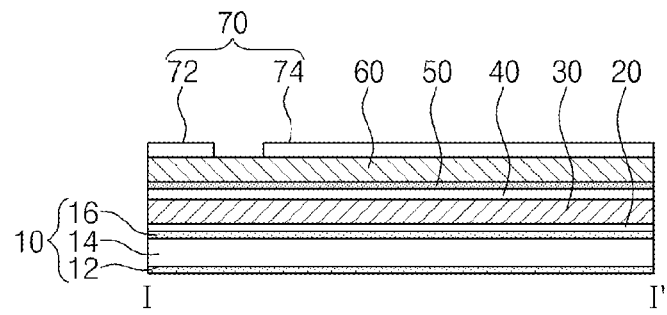

Referring to FIGS. 1 and 11, the cantilever 10 may be patterned, and a portion of the substrate 100 may be removed to define a body 110 and a proof mass 120 which are separated from each other. Accordingly, the cantilever 10 may be formed to extend from the body 110 onto the proof mass 120. The cantilever 10 may be patterned using a dry etching process, for example, a reactive ion etching (RIE) process. The substrate 100 between the body 110 and the proof mass 120 may be removed using a reactive ion etching (RIE) process or a chemical vapor etching process. The chemical vapor etching process may employ xenon fluoride ($XeF_2$) as an etchant. The cantilever 10 may have a length of about 1 millimeter to about 5 millimeters and a width of about 0.5 millimeters to about 0.8 millimeters. The cantilever 10 may be formed using a MEMS technique.

Thus, the methods of fabricating the energy harvesting device according to the exemplary embodiments can increase or maximize the throughput.

According to the exemplary embodiments set forth above, a first piezoelectric layer and a second piezoelectric layer may be disposed on a cantilever between a body and a proof mass, and the first and second piezoelectric layers may have a vertical harvesting mode and a horizontal harvesting mode. Further, a magnetic layer may be disposed between the first and second piezoelectric layers, and the magnetic layer may have a magnetic force for controlling a resonance frequency of the cantilever and the proof mass together with an external magnetic field. Thus, the output power of an energy harvesting device can be increased or maximized. Further, the energy harvesting device can be fabricated using silicon processing techniques. Thus, the fabrication methods according to the exemplary embodiments may increase or maximize the throughput of the energy harvesting device.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. An energy harvesting device, the device comprising:
   a body;
   a proof mass spaced apart from the body;
   a cantilever extending from the body onto the proof mass;
   a first electrode layer on the cantilever opposite to the body;
   a first piezoelectric layer on the first electrode layer;
   a second electrode layer on the first piezoelectric layer;
   a second piezoelectric layer on the second electrode layer;
   a pair of third electrode layers on the second piezoelectric layer; and
   a magnetic layer between the second electrode layer and the second piezoelectric layer.

2. The device of claim 1, wherein the magnetic layer has a magnetic force for controlling a resonance frequency of the cantilever and the proof mass together with an external magnetic field applied to the proof mass.

3. The device of claim 2, wherein the magnetic layer includes a hard magnetic material and/or a soft magnetic material.

4. The device of claim 3, wherein the hard magnetic material includes at least one of carbon steel, strontium rubidium oxide, barium ferrite (Ba-ferrite), samarium cobalt 5 (SmCo5) and neodymium iron boride ($Nd_2Fe_{14}B$).

5. The device of claim 3, wherein the soft magnetic material includes at least one of ferrite, silicon steel and permalloy.

6. The device of claim 2, wherein the resonance frequency of the cantilever and the proof mass is controlled by intensity of the magnetic force of the magnetic layer.

7. The device of claim 1, wherein the body and the proof mass include a single crystalline silicon substrate or a silicon-on-insulator (SOI) substrate.

8. The device of claim 1, wherein the cantilever includes:
   a first buffer layer between the body and the proof mass;
   a shim plate on the first buffer layer opposite to the body and the proof mass;
   a second buffer layer on the shim plate opposite to the first buffer layer.

9. The device of claim 8, wherein the shim plate includes a single crystalline silicon material, a polycrystalline silicon material or an amorphous silicon material.

10. The device of claim 8, wherein each of the first and second buffer layers includes a silicon oxide layer.

11. The device of claim 1, wherein each of the first and second piezoelectric layers includes at least one of a piezoelectric ceramic material, a piezoelectric semiconductor and a piezoelectric polymer material.

12. The device of claim 11, wherein each of the piezoelectric ceramic material, the piezoelectric semiconductor and the piezoelectric polymer material includes at least one of PZT, PVDF, PMN-PT, PZN-PT, PMN-PZT, ZnO and AlN.

13. The device of claim 1, wherein the first electrode layer, the first piezoelectric layer and the second electrode layer have a vertical harvesting mode of the cantilever and the proof mass.

14. The device of claim 1, wherein the pair of third electrode layers and the second piezoelectric layer have a horizontal harvesting mode of the cantilever and the proof mass.

15. The device of claim 14, wherein the pair of third electrode layers include a first inter-digital electrode and a second inter-digital electrode which are located at the same level and combined with each other.

16. The device of claim 1, wherein each of the first, second and third electrode layers includes at least one of a platinum layer and a titanium layer.

17. A method of fabricating an energy harvesting device, the method comprising:
   providing a substrate;
   forming a cantilever on the substrate;
   forming a first electrode layer on the cantilever;
   forming a first piezoelectric layer on the first electrode layer;
   forming a second electrode layer on the first piezoelectric layer
   forming a magnetic layer on the second electrode layer;
   forming a second piezoelectric layer on the magnetic layer;
   forming a pair of third electrode layers separated from each other in a horizontal direction on the second piezoelectric layer; and
   patterning the cantilever and removing a portion of the substrate to define a body and a proof mass separated from each other.

18. The method of claim 17, wherein forming the cantilever includes:
   forming a first buffer layer on the substrate;
   forming a shim plate on the first buffer layer; and
   forming a second buffer layer on the shim plate.

19. The method of claim 17, wherein the magnetic layer is formed to include a hard magnetic material and/or a soft magnetic material using a sputtering process or a spin coating process.

20. The method of claim 17, wherein the cantilever is patterned using a dry etching process, and the substrate between the body and the proof mass is removed using a reactive ion etching (RIE) process or a chemical vapor etching process.

* * * * *